United States Patent
Van Elzakker et al.

(10) Patent No.: US 11,329,637 B2
(45) Date of Patent: May 10, 2022

(54) GENERATOR AND METHOD FOR GENERATING A CONTROLLED FREQUENCY

(71) Applicant: SEMIBLOCKS B.V., s-Hertogenbosch (NL)

(72) Inventors: Michiel Van Elzakker, Eindhoven (NL); Rob Van Der Valk, Capelle aan de IJssel (NL); Kees Van Nieuwburg, 's-Hertogenbosch (NL)

(73) Assignee: SEMIBLOCKS B.V., 's-Hertogenbosch (NL)

( * ) Notice: Subject to any disclaimer, the term of this patent is extended or adjusted under 35 U.S.C. 154(b) by 0 days.

(21) Appl. No.: 17/434,697

(22) PCT Filed: Feb. 24, 2020

(86) PCT No.: PCT/NL2020/050119
§ 371 (c)(1),
(2) Date: Aug. 27, 2021

(87) PCT Pub. No.: WO2020/175987
PCT Pub. Date: Sep. 3, 2020

(65) Prior Publication Data
US 2022/0038081 A1 Feb. 3, 2022

(30) Foreign Application Priority Data
Feb. 27, 2019 (NL) .................................. 2022647

(51) Int. Cl.
*H03K 5/26* (2006.01)
*H03K 5/00* (2006.01)
(Continued)

(52) U.S. Cl.
CPC ......... *H03K 5/00006* (2013.01); *H03K 5/125* (2013.01); *H03K 5/26* (2013.01); *H03L 7/0992* (2013.01)

(58) Field of Classification Search
CPC ...... H03K 5/00006; H03K 5/125; H03K 5/26; H03L 7/0992; H03L 1/02; H03L 7/087; H03L 7/113; H03L 7/16; H03L 7/235
(Continued)

(56) References Cited

U.S. PATENT DOCUMENTS 6,420,938 B1 * 7/2002 Hoff .................. H03L 1/022
331/116 R
8,384,452 B1 * 2/2013 Parker ................. H03L 7/18
327/147
(Continued)

FOREIGN PATENT DOCUMENTS

EP 2602936 B1 2/2014
NL 2022646 B1 9/2020
(Continued)

OTHER PUBLICATIONS

Azcondo et al., "Frequency Correction and Frequency Locked Loop for A Microcomputer Compensated Crystal Oscillator", Proceedings of IECON '93—19th Annual Conference of IEEE Industrial Electronics, IEEE, Nov. 15-19, 1993, pp. 1979-1984.
(Continued)

*Primary Examiner* — Ryan Jager
(74) *Attorney, Agent, or Firm* — AEON Law, PLLC; Adam L. K. Philipp; David V. H. Cohen

(57) ABSTRACT

A frequency generator for generating a controlled signal having a controlled frequency uses a frequency ratio generator with an input; a frequency divider for dividing the controlled frequency by a frequency ratio signal to generate a divided signal having a divided frequency; a converter for
(Continued)

generating an excitation signal having the divided frequency, the excitation signal exciting a resonator for generating a resonance signal having a resonance frequency; a frequency phase detector of a phase difference between the divided frequency and the resonance frequency; an inner loop filter for generating the frequency ratio signal and filtering the phase difference signal to prevent instability of two frequency ratio generator loops; an output configured for providing the frequency ratio signal based on a ratio between the controlled frequency and the resonance frequency; and a controlled oscillator circuit for generating the controlled signal based on comparison of the frequency ratio with a target ratio.

17 Claims, 7 Drawing Sheets

(51) Int. Cl.
 *H03K 5/125* (2006.01)
 *H03L 7/099* (2006.01)
(58) Field of Classification Search
 USPC .......................................... 327/117
 See application file for complete search history.

(56) References Cited

U.S. PATENT DOCUMENTS

| | | | | |
|---|---|---|---|---|
| 8,384,453 B1* | 2/2013 | Caviglia | ............... | H03L 7/0992 327/147 |
| 2009/0190707 A1* | 7/2009 | Clovis | .................... | H03L 7/197 375/376 |
| 2013/0076415 A1* | 3/2013 | Hara | .................... | H03L 7/0992 327/159 |
| 2014/0152354 A1* | 6/2014 | McLeod | ................. | H03L 7/235 327/117 |
| 2014/0312980 A1* | 10/2014 | Villard | .................... | H03L 7/093 331/2 |
| 2022/0038081 A1* | 2/2022 | Van Elzakker | .... | H03K 5/00006 |

FOREIGN PATENT DOCUMENTS

| | | |
|---|---|---|
| NL | 2022647 B1 | 9/2020 |
| WO | 2013066161 A1 | 5/2013 |
| WO | 2020175986 A1 | 9/2020 |
| WO | 2020175987 A1 | 9/2020 |
| WO | 2020175988 A1 | 9/2020 |

OTHER PUBLICATIONS

International Search Report and Written Opinion, International Application No. PCT/NL2020/050119, dated Jun. 30, 2020, 11 pages.
International Search Report and Written Opinion, International Application No. PCT/NL2020/050120, dated Jun. 30, 2020, 11 pages.
International Search Report and Written Opinion; International Application No. PCT/NL2020/050118, dated May 20, 2020, 11 pages.
Li et al., "A Novel Microcomputer Temperature-Compensating Method for An Overtone Crystal Oscillator", IEEE Transactions on Ultrasonics Ferroelectrics and Frequency Control, vol. 52, No. 11, Nov. 2005, pp. 1919-1922.

* cited by examiner

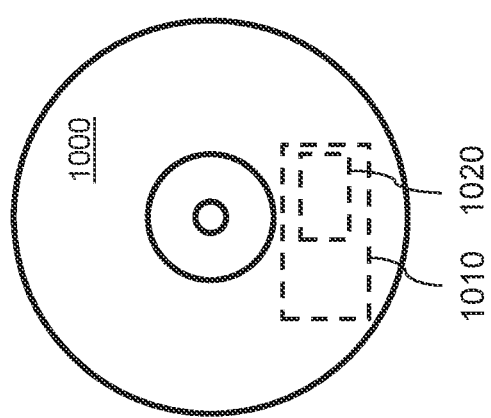

GENERATOR AND METHOD FOR GENERATING A CONTROLLED FREQUENCY

FIELD OF THE INVENTION

The invention relates to the field of generators and methods for generating a controlled frequency, which is highly stable.

BACKGROUND OF THE INVENTION

Generating a signal having a controlled frequency can be a useful electronic building block in different electronic circuits with very divers functionalities.

A known circuit that generates frequencies is known from WO 2013/066161 A1, specifically FIG. 2.

WO 2013/066161 A1 discloses an electronic oscillator circuit, comprising a first oscillator, for supplying a first oscillation signal, a second oscillator, for supplying a second oscillation signal, a first controller for delivering the first control signal as a function of a phase difference between a first controller input and a second controller input of the first controller; a second controller for delivering the second control signal as a function of a phase difference between a first controller input of the second controller and a second controller input of the second controller; a resonator; at least a second resonance frequency, with a first phase shift dependent on the difference between the frequency of a second exciting signal and the second resonance frequency and processing means, for receiving the first oscillator signal and the second oscillator signal, determining their mutual proportion, looking up a frequency compensation factor in a prestored table and outputting a compensated oscillation signal.

In FIG. 2 of WO 2013/066161 A1 the divider setting of the feedback divider determines the ratio between the resonator frequency and the frequency output.

A disadvantage of the circuit in FIG. 2 of WO 2013/066161 A1 is that the frequency is not controllable. Furthermore, a disadvantage is that the circuit has only one feedback loop. Having only one feedback loop causes all noise sources in the loop to contribute to the phase noise of the output frequency. Hence, the loop filter in this circuit must be a trade-off between high bandwidth for tracking changes in the loop and low bandwidth damping all noise sources in the loop.

US 2014/152354 A1 discloses a method of tuning the frequency of a generated signal to form an output signal including: forming the generated signal at a signal generator; comparing a feedback signal with a reference signal and generating a control signal in dependence on that comparison, wherein the feedback signal is generated using the output signal; and generating the output signal by performing a frequency-dividing operation in dependence on the generated signal and a dividing factor, wherein the dividing factor is determined in dependence on the control signal. A disadvantage of US 2014/152354 A1 is that the output signal may have a phase noise making the method unsuitable for demanding.

SUMMARY OF THE INVENTION

An object of the invention is to overcome one or more of the disadvantages mentioned above.

According to a first aspect of the invention, frequency generator for generating a controlled signal having a controlled frequency, comprising:
a frequency ratio generator arranged for generating a frequency ratio, comprising:
an input configured for receiving the controlled signal;
a first controlled frequency divider (110) arranged for generating a first divided signal (115) having a first divided frequency being substantially the controlled frequency divided by the first frequency ratio signal;
a converter arranged for generating an excitation signal (129) having the first divided frequency based on the first divided signal, wherein the excitation signal is provided to the resonator for excitation of the resonator;
connectors for connecting to a resonator arranged for generating a resonance signal having a first resonance frequency, wherein the resonator is excited based on the controlled signal; and
an output configured for providing a frequency ratio signal based on a first frequency ratio signal indicative of the frequency ratio between the controlled frequency and the first resonance frequency;
wherein the frequency generator further comprises:
a comparator arranged for generating a comparison signal based on the comparison of the frequency ratio with a target ratio; and
a controlled oscillator circuit arranged for generating the controlled signal having the controlled frequency based on the comparison signal.

The frequency ratio generator outputs the frequency ratio signal. The frequency ratio signal is indicative of the frequency ratio between the controlled frequency and the first resonance frequency. The resonator provides a relatively stable or fixed resonance frequency, which can not be controlled over a wide range of frequencies. The controlled oscillator on the other hand may provide such a broad range of frequencies or cannot be controlled at all. The frequency ratio is settable at a controlled ratio with the target ratio according to the invention. Hence, the current invention provides the advantage of a controlled signal having a controllable frequency over a wide frequency range.

The target ratio may be set to any positive rational number. As an example, the forward error correction in telecommunications necessitates extra bits to be inserted or extracted from a bitstream. Both bitstreams have different frequencies and therefore typically their own clock signals. These clock signals are typically non-integer multiples from each other. The current frequency generator advantageously allows for the generation of non-integer ratios between the controlled frequency and the resonance frequency.

The comparator handles relatively low frequency signals. These signals are relatively small band, from DC upwards. The comparator may therefore be implemented in a DSP or CPU providing the advantage that additional features may be easily implemented without direct hardware consequences. Hence, the current frequency generator has the advantage to be highly adaptive to new or additional functionalities.

For a detailed description of the frequency generator used as element in this invention, reference is made to the text filed as patent application NL2022646. This text is hereby incorporated as a whole. Specific reference is made to the embodiments in this text incorporating a resonator. Also, specific reference is made to definitions and ranges, which also apply to the current invention.

The controlled signal is typically a low phase noise signal, such as in the range of less than 500 fs, preferably 200 fs, more preferably 100 fs, most preferably 80 fs in a frequency range of 8 kHz to 24 MHz, preferably 10 kHz to 22 MHz, more preferably 12 kHz to 20 MHz, most preferably 14 kHz to 18 MHz.

In an embodiment of the invention, the frequency generator comprises:
  an outer loop filter arranged for generating a filtered comparison signal based on the comparison signal;
  wherein the controlled frequency is based on the filtered comparison signal;
  wherein an outer loop is formed by the frequency ratio generator, the comparator, the comparison signal, the outer loop filter, the filtered comparison signal, the controlled oscillator and the controlled signal; and
  wherein the outer loop filter filters the comparison signal such that instability of the outer loop is prevented.

Instability of the loop may be detected from an instable controlled frequency of the controlled signal. Typically, the frequency ratio generator has an inner loop, which is a low-pass filter with a cut-off frequency. The outer loop filter is typically also a low-pass filter. Furthermore, the cut-off frequency of the outer loop is selected such low that the maximum amount of noise is rejected to allow the controlled oscillator to generate the controlled signal with the least amount of phase noise. On the other hand, the cut-off frequency should be selected such high that changes in the outer loop due to for example temperature changes or hysteresis can be tracked such that the controlled frequency stays stable. Furthermore, the cut-off frequency should be selected such high that start-up delay is minimized. Both loop filters typically have, next to a proportional behaviour also an integrating behaviour. The integrating behaviour in a static situation or stable mode causes the loop where the loop filter is part of to carry no residual error for advantageously increasing the accuracy of achieving the target ratio.

In an embodiment of the invention, the comparator comprises a subtractor arranged for providing the comparison signal based on subtracting the target ratio from the frequency ratio; and/or
wherein the comparator comprises a divider arranged for providing the comparison signal based on dividing of the frequency ratio by the target ratio.

The subtractor may comprise and adder with a signal invertor on one input. The divider may comprise a multiplier with a reciprocal value fed to one of its inputs. The measured ratio is typically compared to a target ratio. The target ratio may be predefined, set or continuously changed by another feedback loop. The target ratio may be changed, such as temporarily, continuously or permanently, to align the phase of the controlled frequency to the phase of a resonance signal of the resonator.

As the frequency ratio is controlled, the frequency ratio will typically be substantially or at least close to the target ratio during stable operation. Thus, it may be stated that:

$t$ = target ratio $r$ = frequency ratio $$t - r = \frac{r}{r}(t - r) = r\left(\frac{t}{r} - 1\right) \approx \frac{t}{r} - 1, \lim r \to 1$$

The preceding condition is typically satisfied during stable operation and wherein the frequency ratio is normalized in respect to the target ratio. Thus, for stable operation, the subtractor and divider with an offset of −1 may be seen as identical. The behaviour of the frequency ratio generator and thus also the frequency generator may be different during start-up or power-up and during compensating for larger disturbances in the frequency generator, especially in the different loops.

In an embodiment of the invention, the frequency ratio generator comprises:
  a first controlled frequency divider arranged for generating a first divided signal having a first divided frequency being substantially the controlled frequency divided by the first frequency ratio signal;
  a converter arranged for generating an excitation signal having the first divided frequency based on the first divided signal, wherein the excitation signal is provided to the resonator for excitation of the resonator;
  a first frequency phase detector arranged for generating a first phase difference signal based on a first frequency phase difference between the first divided frequency and the first resonance frequency; and
  a first inner loop filter arranged for generating the first frequency ratio signal;
  wherein a first frequency ratio generator loop is formed by the first controlled frequency divider, the first divided signal, the first frequency phase detector, the first phase difference signal, the first inner loop filter and the first frequency ratio signal;
  wherein a second frequency ratio generator loop is formed by the first controlled frequency divider, the first divided signal, the converter, the excitation signal, the resonator, the resonance signal, the first frequency phase detector, the first phase difference signal, the first inner loop filter and the first frequency ratio signal; and
  wherein the first inner loop filter filters the first phase difference signal such that instability of the frequency ratio generator loops are prevented.

The controlled frequency divider, such as the first controlled frequency divider, may be a digital controlled frequency divider. The controlled frequency divider may be a controlled multiple frequency divider or a controlled fractional frequency divider. The frequency phase detector, such as the first frequency phase detector, may be a frequency mixer, analogue multiplier, digital circuit or logic circuit configured as phase detector. Alternatively, the frequency phase detector may be a digital mixer, such as an XOR-port mixer.

The controlled frequency divider divides the frequency of the first input signal depending on the control signal, such as the first control signal. Typically, the control signal is a stabilized signal having a low jitter to prevent the introduction of significant additional jitter in the controlled frequency divider. The control signal may contain an offset. The divided signal, such as the first divided signal, typically contains the jitter or noise introduced by the controlled frequency divider as dominant noise source.

The frequency phase detector detecting the phase between a frequency of the divided signal and a frequency of the second input signal, such as the resonance signal, typically also introduces noise. Therefore, the value, such as the height, of the phase difference signal is typically dominated by the phase difference and typically additionally comprises the noise introduced by the controlled frequency divider and the frequency phase detector.

The loop filter, such as the first loop filter, filters the phase difference signal. The output signal of the loop filter is the control signal, which is indicative of the frequency ratio. The loop filter is typically a low-pass filter. The loop filter cut-off frequency is selected based on two limitations. If the cut-off frequency is selected too low, the loop will react too slow to disturbances in the loop causing instability of the loop. If the cut-off frequency is selected too high, the loop will not reject the noise in the phase difference signal enough also possibly causing instability of the loop. Instability of the loop may be detected from an instable control signal. An instable control signal may have a signal value swinging from one end of the range to another end of its range or be stuck at one of the extremes. The cut-off frequency is typically selected such low that the maximum amount of noise is rejected from the phase difference signal while the control signal is still allowed to adapt quickly enough to any disturbances introduced in the loop.

The frequency ratio generator provides the advantage of a very stable frequency ratio measurement. The frequency ratio generator according to the current invention has a feedback loop having an integrating effect. The integrating effect provides the advantage of a 20 dB/decade rejection of low frequency noise for the phase. This effect in the frequency domain causes a 40 dB/decade rejection, while known systems only have a 20 dB/decade rejection.

Furthermore, the frequency ratio generator provides that the temperature behaviour of the filtering components, such as the loop filter, is transposed to nearly DC with the effect of that small deviations only slightly changes the effective bandwidth, but does not change the actual centre frequency. In comparison, known in the art are loop filters, wherein the known loop maintains a certain frequency and thus these known loop filters are band-pass filters. If components of the known loop filter change in value under the influence of temperature or aging for example, the centre frequency of the known loop filter will change. Therefore, the circuit according to the current invention provides the advantage of an increased temperature stability.

This frequency ratio generator is having a resonator providing the resonance signal and providing an excitation signal to the resonator based on the divided signal. As further detailed below the circuit provides the advantage of not having to comply to the Barkhausen criterium. This not complying to the Barkhausen criterium has the effect of reducing the phase noise.

Prior art loops complying to the Barkhausen criterium may be compared to an AM-signal transmission. The current invention, not complying to the Barkhausen criterium may be compared to an FM-signal transmission. FM-signals are known to be less prone to disturbances. One of such disturbances in the current invention may be a small and adjacent resonance frequency. These small and adjacent resonance frequencies may even cross-over, for example under the influence of a temperature change. Especially in these cases not having to comply to the Barkhausen criterium provides the advantage of a considerable rejection of the noise generated by the small and adjacent resonance frequency.

Generating particular frequencies with low phase noise requires a substantial amount of power. This frequency generator provides the advantage of two independent frequencies, the controlled frequency and the resonance frequency, loosely coupled via the frequency ratio and both with low phase noise without doubling the power, but with much less power consumed by the circuit.

In an embodiment of the invention, the phase difference signal has a magnitude, such as an amplitude or a value, based on the frequency phase difference and/or the control signal has a magnitude, such as an amplitude or a value, indicative of the frequency ratio. If the phase or control signal is an analogue signal, the signal information is typically advantageously contained in the amplitude of the signal. If the phase or control signal is a digital signal, the signal information is typically advantageously contained in a digital value of the signal. The digital value may be a binary code, BCD code, Gray code or combination of these codes or any other code having a defined value system.

In an embodiment of the invention, the loop filter is a lowpass filter, preferably having a cut-off frequency advantageously below the frequency noise introduced by the controlled frequency divider and preferable advantageously above a rate of change of the first and second frequencies. Furthermore, the cut-off frequency should be advantageously selected such that the control signal is inside a specified range, while the circuit remains stable under changing conditions causing disturbances in the circuit. The specified range is typically user specified. The specified range may also be determined based on the noise introduced by the other features in the circuit, such as the controlled frequency divider and the frequency phase detector. The specified range may also be influenced by the variations of the first input signal and the second input signal.

In an embodiment of the invention, the controlled frequency divider is a controlled fractional frequency divider. A phase difference between the divided signal and the second input signal may be caused by a static phase difference and/or a frequency difference and lapsing time. In this embodiment, the use of a controlled fractional frequency divider advantageously allows for improved frequency matching between the frequency of the divided signal and the second frequency because the first frequency is divided with a higher granularity. Furthermore, as the granularity is higher, the first frequency may advantageously be selected lower. The use of high frequencies has the disadvantage of cross-talk, increased energy loss, etc.

The resonator may be a crystal resonator and preferably the resonance frequency is an overtone resonance frequency of the crystal resonator. The resonator is typically a resonator allowing resonances of different frequencies at the same time. A crystal is a readably available solution for a resonator. Harmonic frequencies change in frequency under the influence of temperature in a similar manner as the fundamental frequency. In contrast, overtone frequencies may change frequency in a different manner under the influence of temperature. Furthermore, different overtones of a crystal may change in frequency in a different manner under the influence of temperature. Thus, different overtones may have different temperature gradients. As an overtone of the crystal may be selected, the circuit can advantageously be designed to have a predefined temperature behaviour based on the predefined behaviour of the resonator.

As described, if at least one, but preferably two of the divided frequencies are selected at an overtone frequency, the temperature behaviour may be different. The temperature may vary in a temperature range of −40° C. to +125° C. Within this range the temperature gradient for a certain overtone may vary.

In an embodiment of the invention, the frequency ratio generator comprises:
  a second controlled frequency divider arranged for generating a second divided signal having a second divided frequency being substantially the controlled frequency divided by a second frequency ratio signal;
  a second frequency phase detector arranged for generating a second phase difference signal based on a second frequency phase difference between the second divided frequency and the second resonance frequency;

a second inner loop filter arranged for generating the second frequency ratio signal indicative of the second frequency ratio based on the second phase difference signal; —an adder arranged for generating an added signal supplied to the converter, wherein the added signal has the first divided frequency and the second divided frequency;

a temperature compensator for compensating changes in resonance frequency of the resonator, wherein the temperature compensator comprises:

an input configured for receiving the first frequency ratio and the second frequency ratio;

a first divider arranged for generating a first division value based on dividing of the first frequency ratio and the second frequency ratio;

a calculator arranged for calculating a compensation factor based on the value of one or more of the group of the first phase difference signal, the second phase difference signal, the first frequency ratio and the first division value, wherein the calculator comprises preferably a look-up table; and a redresser arranged for generating the frequency ratio based on redressing a signal based on one or more of the group of the first phase difference signal, the second phase difference signal and the first frequency ratio with the compensation factor;

wherein the excitation signal is based on the added signal;

wherein a third frequency ratio generator loop is formed by the second controlled frequency divider, the second divided signal, the second frequency phase detector, the second phase difference signal, the second inner loop filter and the second frequency ratio signal;

wherein a fourth frequency ratio generator loop is formed by the second controlled frequency divider, the second divided signal, the converter, the excitation signal, the resonator, the resonance signal, the second frequency phase detector, the second phase difference signal, the second inner loop filter and the second frequency ratio signal;

wherein the second inner loop filter filters the second phase difference signal such that instability of the frequency ratio generator loops is prevented.

The frequency ratio generator loops are parallel and are evaluated simultaneously, the temperature effects are measured at the same time. Known circuits may have the tendency to measure temperature effects spaced in time. This time spacing causes temperature inaccuracies in known circuits if the temperature changes over time. The ratio generator according to the current invention has therefore the advantage of improved accuracy of the temperature measurement.

In an embodiment of the invention, the frequency ratio generator comprises:

a selector arranged for selecting one or more of the group of the first phase difference signal, the second phase difference signal and the first frequency ratio based on the value of one or more of the group of the first frequency ratio and the first division value; and wherein the redresser is arranged for generating the frequency ratio based on redressing the selected frequency ratio with the compensation factor.

This embodiment of the ratio frequency generator advantageously uses the property of the resonator that the resonator may resonate at multiple frequencies at the same time. Resonators are typically bulky compared to the other elements of the circuit. Thus, using the resonator to resonate at multiple frequencies allows integration and miniaturization of the circuit.

Furthermore, the selector advantageously may select the frequency ratio most stable for a certain temperature such that the frequency ratio does not change much due to temperature changes. Furthermore, the redresser may base the compensation factor predominantly on the parameter having the highest change of value for a certain temperature range. The parameters may also be used to determine the temperature.

In an embodiment of the invention, the frequency ratio generator comprises:

a third controlled frequency divider arranged for generating a third divided signal having a third divided frequency being substantially the controlled frequency divided by a third frequency ratio signal;

a third frequency phase detector arranged for generating a third phase difference signal based on a third frequency phase difference between the third divided frequency and the third resonance frequency;

a third inner loop filter arranged for generating the third frequency ratio signal indicative of the third frequency ratio based on the third phase difference signal;

wherein the added signal also has the third divided frequency;

wherein the input of the temperature compensator is further configured for receiving the third frequency ratio; and wherein the temperature compensator further comprises:

a second divider arranged for generating a second division value based on dividing of the first frequency ratio and the third frequency ratio;

wherein, when depending on embodiment 6, the selector is further arranged for selecting also from the group of the third phase difference signal, the second frequency ratio and the third frequency ratio and also based on the value of one or more of the extended group of the second frequency ratio, the third frequency ratio and the second division value;

wherein the calculator is further arranged for calculating the compensation factor based on the value of one or more of the group extended with the third phase difference signal, the second frequency ratio, the third frequency ratio and the second division value;

wherein the redresser is arranged for generating the frequency ratio based on redressing the selected frequency ratio with the compensation factor;

wherein a fifth frequency ratio generator loop is formed by the third controlled frequency divider, the third divided signal, the third frequency phase detector, the third phase difference signal, the third inner loop filter and the third frequency ratio signal;

wherein a sixth frequency ratio generator loop is formed by the third controlled frequency divider, the third divided signal, the converter, the excitation signal, the resonator, the resonance signal, the third frequency phase detector, the third phase difference signal, the third inner loop filter and the third frequency ratio signal; and wherein the third inner loop filter filters the third phase difference signal such that instability of the frequency ratio generator loops is prevented.

This embodiment advantageously allows to measure hysteresis behaviour of the resonator during operation. Known circuits tend to compensate for hysteresis in the resonator by designing in countermeasures from a theoretical point. Hence, this embodiment provides the advantage of improved accuracy due to hysteresis measurement.

In an embodiment of the invention, the selector of the frequency ratio generator is arranged for:
- selecting one of the group of the first frequency ratio, the second frequency ratio and the third frequency ratio, wherein the selected ratio is based on the value of one or more of the group of the first frequency ratio, the second frequency ratio, the third frequency ratio, the first division value and the second division value; or
- selecting a weighted combination of two or more of the first frequency ratio, the second frequency ratio and the third frequency ratio, wherein the weighted combination is based on the value of one or more of the group of the first frequency ratio, the second frequency ratio, the third frequency ratio, the first division value and the second division value.

The previously mentioned advantages for the selector apply also to this more elaborate embodiment of the selector. Furthermore, this version of the selector allows for a more balanced combination with the weighted combination. For example, the weighted combination allows advantageously for mixing and matching of different performance aspects, such as Allan variance or phase noise.

In an embodiment of the invention, the first division value is solely based on the first frequency ratio signal and the second frequency ratio signal;
the second division value is solely based on the first frequency ratio signal and the third frequency ratio signal;
the selector is arranged for selecting one or more of the limited group of the first phase difference signal, the second phase difference signal and the third phase difference signal; and/or
the calculator is arranged for calculating a compensation factor based on the value of one or more of the limited group of the first division value and the second division value. This embodiment advantageously limits the amount of choices in the different groups to the signals and/or ratios best suitable for providing the compensation factor, such as for changes in parameters of the different components due to temperature changes.

In an embodiment of the invention, the frequency ratio generator comprises an analogue to digital converter arranged for generating a digital resonance signal based on the resonance signal, wherein the digital resonance signal is supplied to at least the first frequency phase detector. Depending on the operation, manipulating input signals in the digital or analogue domain may advantageously be done in one of the domains. Typically, the resonator is an analogue component readily available. Further typically, a frequency phase detector is easier to implement in the digital domain. The ADC advantageously provides a coupling of the analogue and digital domain to benefit from the availability on one hand and ease of implementation on the other hand.

In an embodiment of the invention, the converter of the frequency ratio generator comprises a digital to analogue converter arranged for generating the excitation signal based on the divided signal. A digital controlled frequency divider is simpler in implementation and can be easily controlled. The resonator is an analogue component. Adding a DAC between the digital controlled frequency divider and the resonator provides the advantage of coupling two advantageous partial solutions in the digital and analogue domain respectively.

In an embodiment of the invention, the comparator comprises:
- a scaler arranged for generating a scaled signal, which is the frequency ratio signal scaled by a scaling factor; and/or
- a shifter arranged for generating a shifted signal, which is the scaled signal shifted by a shift value;

wherein the comparison signal is based on the shifted signal.

The controlled oscillator typically has an input for controlling the controlled frequency of the controlled signal. The input signal, fed into the input of the controlled oscillator, is based on the comparison signal. Depending on the embodiment, other signals may be combined, such as added, subtracted, divided and multiplied, with the comparison signal. The comparison signal may also be manipulated, such as filtered, before becoming the input signal. Typically, if the input to the controlled oscillator is zero, the controlled frequency will have a certain ground frequency or centre frequency. And any deviation from zero in positive or negative direction would result in a positive or negative frequency change, respectively. Applying a scaler and shifter provides the option to manipulate the signal such that the signal is suitable as an input signal for most common controlled oscillators. Furthermore, the scaler and shifter provide the advantage of introducing an additional offset. The additional offset may for example be used in a telecommunication system requiring some extra space for inserting signalling into a bitstream.

The controlled oscillator may be implemented in many different embodiments. The controlled oscillator may be a voltage-controlled oscillator, optionally with the output of a DAC providing the signal for the control input of the voltage-controlled oscillator. The controlled oscillator may also be an all-digital PLL.

In an embodiment of the invention, the frequency generator comprises:
- a phase acquisition circuit arranged for generating a phase delta signal based on the phase difference between the controlled frequency and a reference signal having a reference frequency; and
- a PLL arranged for generating an offset signal based on the phase delta signal;

wherein the controlled frequency is also based on the offset signal.

Adding the PLL, preferably digital PLL, allows for phase and frequency tracking of an external signal having a particular frequency. The external signal may have a considerable phase jitter, such as a carrier wave for a telecommunications protocol. The frequency generator may advantageously generate a very stable controlled signal having a very stable controlled frequency. The controlled frequency is typically controlled such that the controlled frequency may be used as reference while receiving the communication carried by the carrier wave.

An advantage of this embodiment, when implemented for the larger part in the digital domain, is that the frequency generator allows for the different noise sources, such as the external signal, the resonator and the controlled oscillator, to be identified and at least partly compensated for through the architecture, such as the loops, specifically the loop filters, of the frequency generator. For example, the resonator is typically influenced by temperature, causing a change in resonance in the range of a 10's of kHz. This while the controlled oscillator typically creates phase noise in the multi 100 kHz or even MHz range which may be due to Fermi sea, Brownian motion, etc.

The resonator and the controlled oscillator are typically elements implemented in the analogue domain. The larger part of the frequency generator, advantageously implemented in the digital domain, may require implementation in dedicated hardware, but may also allow a part of the implementation done in software.

Loops comprising a resonator or oscillator commonly adhere to the Barkhausen criterium. The Barkhausen criterium contains the following constrains:

the absolute magnitude of the gain of the loop equals 1; and the phase shift of the loop is $2\pi x$; $x \in \mathbb{N}_0^+$ The Barkhausen criterium typically implies additional design constrains for the resonator loop. A loop complying to the Barkhausen criterium is typically hard to design and introduces additional phase noise. Typically, a loop comprising a regular amplifier for making the loop comply to the Barkhausen criterium introduces considerable phase noise and consumes considerable power. The controlled oscillator is the only element in the frequency generator, which may comply to the Barkhausen criterium. Therefore, this embodiment provides the advantage of low power and low amount of phase noise introduction.

In a further embodiment of the invention:

when comprising a shift value, the shift value is the offset signal; or when comprising a filtered comparison signal, the filtered comparison signal is indirectly based on the offset signal.

In the first option the offset signal is fed through the outer loop filter, while in the second option the offset signal is not fed through the outer loop filter. In the context of this text, the word directly and indirectly based on for a signal mean if the input signal contributes to the resulting signal or via a loop, respectively. The first option advantageously limits the number of filters in the system. The second option advantageously allows the offset signal to be filtered or unfiltered added to the signal controlling the controlled oscillator. The filter applied to the offset signal may advantageously be designed to the particular needs for filtering the offset signal. This is particularly advantageous as the offset signal typically has the controlled oscillator as primary noise source, having a noise in the multi 100 kHz or even MHz band, while the filtered comparison signal has typically the resonator as primary noise source, having a noise in the 10-s of Hz band.

According to another aspect of the invention, a method for generating a controlled signal having a controlled frequency, comprising the steps of:

receiving a resonance signal having a first resonance frequency from a resonator;

providing a first ratio signal indicative of the first frequency ratio signal between the controlled frequency and the first resonance frequency;

generating a first phase difference signal (155) based on a first frequency phase difference between a first divided frequency and a first resonance frequency;

filtering the first phase difference signal for generating the first frequency ratio signal;

basing a frequency ratio on the first frequency ratio signal;

providing a target ratio;

generating a comparison signal based on the comparison of the frequency ratio with the target ratio;

generating the controlled signal having the controlled frequency based on the comparison signal;

generating a first divided signal (115) having a first divided frequency being substantially the controlled frequency divided by the first frequency ratio signal;

generating an excitation signal (129) having the first divided frequency based on the first divided signal, wherein the excitation signal is provided to the resonator for excitation of the resonator; and outputting the controlled signal;

wherein a first frequency ratio generator loop is formed by the first divided signal, the first phase difference signal and the first frequency ratio signal;

wherein a second frequency ratio generator loop is formed by the first divided signal, the excitation signal, the resonator, the resonance signal, the first phase difference signal and the first frequency ratio signal;

wherein the step of filtering filters the first phase difference signal such that instability of the frequency ratio generator loops are prevented.

According to another aspect of the invention, a frequency generator system comprising:

a frequency generator chip comprising a frequency generator according to any of the preceding embodiments;

a resonator for connecting to the frequency generator chip for generating the resonance signal; and an oscillator for connecting to the controlled oscillator circuit for generating an oscillating signal.

According to another aspect of the invention, a computer program product comprising a computer readable medium having computer readable code embodied therein, the computer readable code being configured such that, on execution by a suitable computer or processor, the computer or processor is caused to perform the steps of the method in an embodiment according to the invention:

providing a first ratio signal;

generating a comparison signal;

generating the controlled signal;

outputting an excitation signal; and outputting the controlled signal.

According to another aspect of the invention, a computer program product comprising a computer readable medium having computer readable code embodied therein, the computer readable code being configured such that, on execution by a suitable computer or processor, the computer or processor is caused to perform the method specified in an embodiment according to the invention.

BRIEF DESCRIPTION OF THE DRAWINGS

The invention will be apparent from and elucidated further with reference to the embodiments described by way of example in the following description and with reference to the accompanying drawings, in which:

FIG. 8 schematically shows an embodiment of a computer program product.

The figures are purely diagrammatic and not drawn to scale. In the figures, elements which correspond to elements already described may have the same reference numerals.

LIST OF REFERENCE NUMERALS

| | |
|---|---|
| 100 | first embodiment frequency ratio generator |
| 101 | second embodiment frequency ratio generator |
| 102 | third embodiment frequency ratio generator |
| 104 | first input signal |
| 105 | third input signal |
| 106 | fourth input signal |
| 107 | (first) control signal |
| 108 | second control signal |
| 109 | third control signal |
| 110 | (first) controlled frequency divider |
| 111 | second controlled frequency divider |
| 112 | third controlled frequency divider |
| 115 | (first) divided signal |
| 116 | second divided signal |
| 117 | third divided signal |
| 120 | adder |
| 121 | added signal |
| 125 | digital to analogue converter (DAC) |
| 129 | excitation signal |
| 130 | resonator |
| 135 | second input signal |
| 140 | analogue to digital converter (ADC) |
| 145 | digital second signal |
| 150 | (first) frequency phase detector |
| 151 | second frequency phase detector |
| 152 | third frequency phase detector |
| 155 | (first) phase difference signal |
| 156 | second phase difference signal |
| 157 | third phase difference signal |
| 160 | (first) loop filter |
| 161 | second loop filter |
| 162 | third loop filter |
| 200 | first embodiment sub-system |
| 201 | second embodiment sub-system |
| 210 | first circuit comprising resonator |
| 211 | second circuit comprising resonator |
| 220 | (first) divider |
| 221 | second divider |
| 225 | first indication |
| 226 | second indication |
| 230 | subtractor |
| 235 | subtracted signal |
| 300 | first embodiment frequency generator |
| 301 | second embodiment frequency generator |
| 310 | comparator |
| 311 | target ratio |
| 312 | frequency ratio signal |
| 315 | comparison signal |
| 320 | outer loop filter |
| 321 | filtered comparison signal |
| 330 | controlled oscillator circuit |
| 331 | controlled signal |
| 340 | phase acquisition circuit |
| 341 | reference signal |
| 345 | phase delta signal |
| 350 | digital PLL |
| 355 | offset signal |
| 356 | adder |
| 357 | oscillator control signal |
| 1000 | computer program product |
| 1010 | computer readable medium |
| 1020 | computer readable code |

DETAILED DESCRIPTION OF EXEMPLARY EMBODIMENTS

The following figures may detail different embodiments. Embodiments can be combined to reach an enhanced or improved technical effect. These combined embodiments may be mentioned explicitly throughout the text, may be hint upon in the text or may be implicit.

Figure 1:
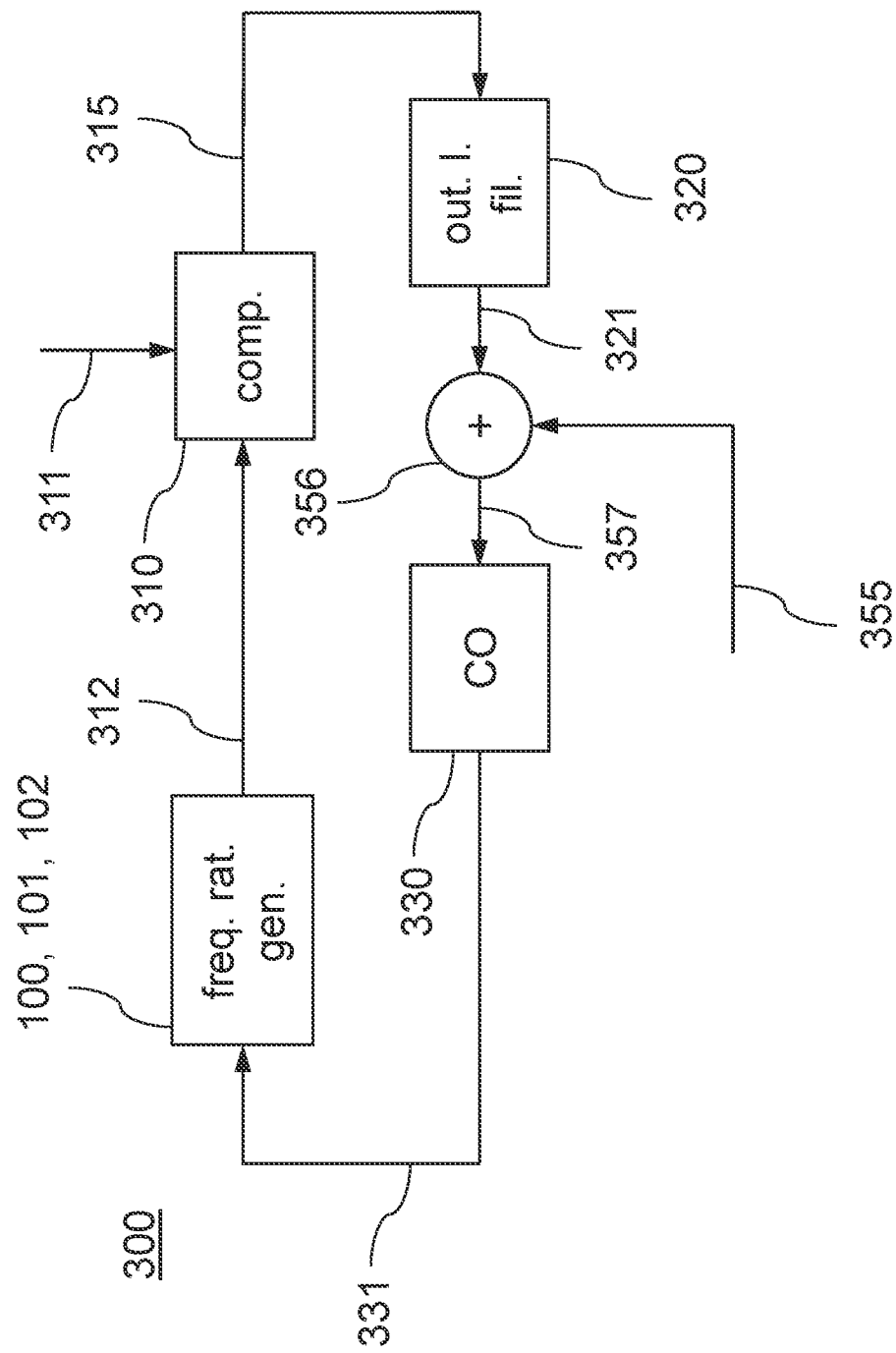
FIG. 1 schematically shows a first embodiment of the frequency generator.

FIG. 1 schematically shows a first embodiment of the frequency generator 300. The frequency generator comprises a frequency ratio generator 100, 101, 102, a comparator 310 and a controlled oscillator 330.

The frequency ratio generator has as input the controlled frequency 331. The controlled frequency is the generated frequency and thus effectively the output of the frequency generator. The frequency ratio generator provides a frequency ratio signal 312.

The frequency ratio generator comprises a resonator. The frequency ratio generator determines a ratio between the controlled frequency and a resonance frequency of the resonator. Further, the frequency ratio generator may determine a ratio between two resonance frequencies of the resonator, wherein at least one of the resonance frequencies is an overtone frequency. Typically, the resonator changes over temperature and shows the effects of hysteresis. The frequency ratio signal may be temperature stabilized or compensated. The frequency ratio signal may be hysteresis stabilized or compensated. The frequency ratio signal may be stabilized or compensated for any other effects of the resonator or any other component in the frequency ratio generator or in the frequency generator.

The comparator has as input the frequency ratio signal and a target ratio 311. The target ratio has typically a predefined value or is selected from a set of predefined values. The predefined values are typically determined by the manufacturer, preferably during manufacturing of the frequency ratio generator or resonator by inline characterisation. The comparator compares the frequency ratio signal to the target ratio and provides as output a comparison signal 315, which is the result of this comparison. Typically, the comparison of the frequency ratio signal and the target ratio is performed by subtraction.

The controlled oscillator has as input a signal based on the comparison signal. The input signal may be a filtered comparison signal with offset 357, a filtered comparison signal 321, the comparison signal or any other signal based on the comparison signal. The output of the controlled oscillator is the controlled frequency 331.

The controlled oscillator is typically an oscillator with a centre frequency. The controlled oscillator is typically highly stable for hysteresis. Typically, the controlled frequency equals centre frequency if the oscillator control signal is 0. Any change of the oscillator control signal, negative or positive, changes the controlled frequency. The change of the controlled frequency is typically linear over a predefined range. The scaling and shifting to obtain a signal suitable as input for the controlled oscillator is advantageously done in the comparator. The controlled oscillator may be implemented with the use of varicaps, LC-network or may be implemented completely in the digital domain.

The frequency generator optionally comprises an outer loop filter 320. The outer loop filter takes the comparison signal as input. The outer loop filter outputs a filtered comparison signal 321. The outer loop filter filters the comparison signal such that instability of the outer loop is prevented. The outer loop is formed by at least the frequency ratio generator, the comparator, the outer loop filter and the controlled oscillator.

The frequency generator optionally comprises an adder 356. The adder takes as a first input the filtered comparison signal, the comparison signal or a signal based on the comparison signal. The adder takes as a second input an offset signal 355. The adder adds the two inputs signals to provide an added signal. The oscillator control signal may be equal to the added signal or may be based on the added signal. This offset signal may be used to shift the added signal to a suitable range as input for the controlled oscillator. The offset signal may also be used to introduce an offset on the oscillator control signal to control the controlled frequency. The offset signal may also be used to introduce an offset, typically a temporal offset, on the oscillator control signal to control the phase of the controlled frequency.

Suppose the frequency ratio generator is stable and a zero offset signal is provided. Furthermore, suppose the controlled frequency is slightly too high. The frequency ratio generator will output a frequency ratio signal signalling the ratio between a resonance frequency of the resonator and the controlled frequency. This frequency ratio will be slightly too high. The comparator will compare the target ratio with the frequency ratio and will conclude that the frequency ratio is slightly too high. The result of this comparison will be shown in the comparison signal. Typically, the comparison signal will be slightly too low compared to its desired settling point. The optional outer loop filter may filter the comparison signal. If the outer loop filter comprises an integrating function, the controlled frequency error may be reduced to zero. A signal based on the comparison signal is provided to the controlled oscillator. The controlled oscillator will react to the slightly too low signal based on the slightly too low comparison signal by lowering the controlled frequency, thereby stabilizing the controlled frequency to a desired frequency. The controlled frequency is at least partly determined by the target ratio setting. The optional offset signal provides an additional means to control the controlled frequency. The offset signal may be injected in the loop before or after the optional outer loop filter.

Figure 3:
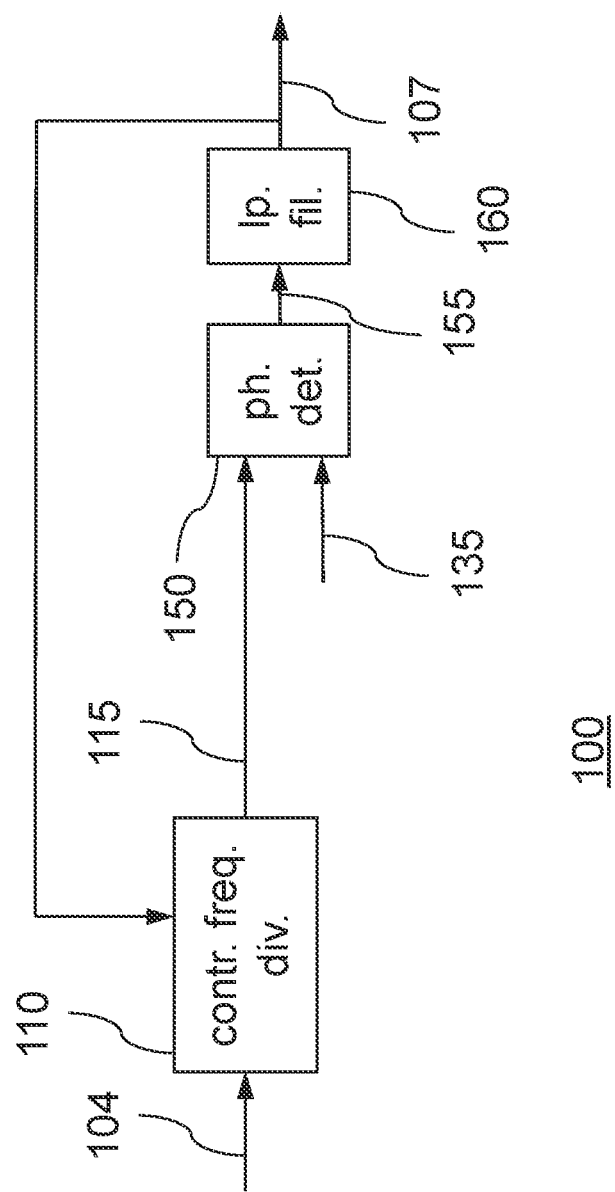
FIG. 3 schematically shows a first embodiment of the frequency ratio generator.

The embodiment of the invention in FIG. 1 may use the embodiment of the frequency ratio generator shown in FIG. 3.

Figure 4:
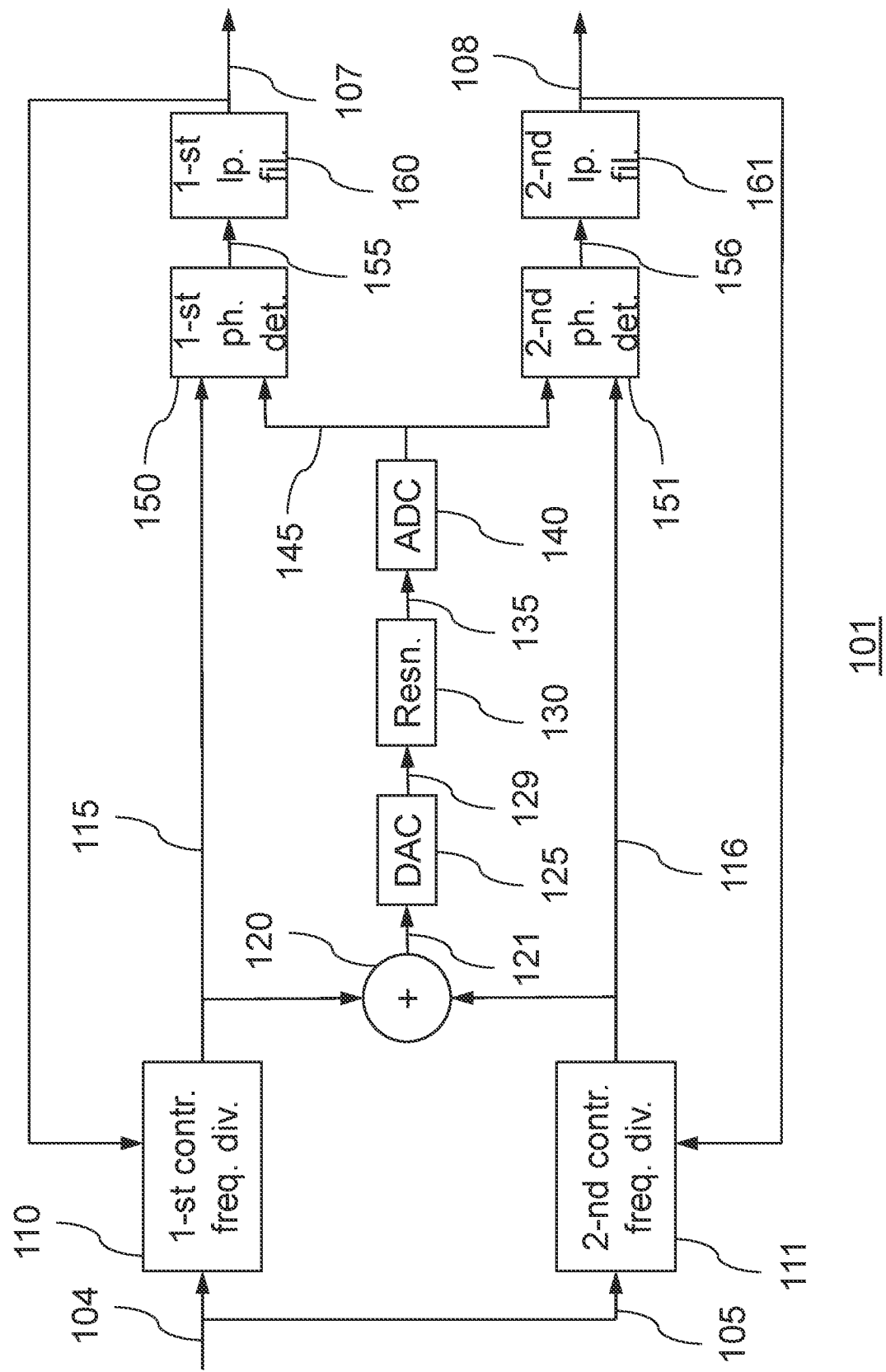
FIG. 4 schematically shows a second embodiment of a frequency ratio generator.
Figure 6:
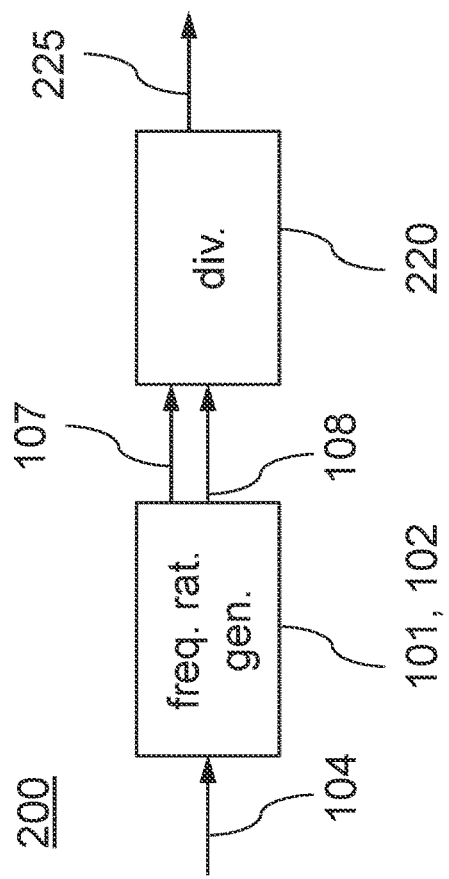
FIG. 6 schematically shows a sub-system for compensating temperature effects.

The embodiment of the invention in FIG. 1 may use the embodiment of the frequency ratio generator shown in FIG. 4 combined with the sub-system shown in FIG. 6 to provide a temperature compensated frequency generator. The frequency generator is especially insensitive to temperature variations when the frequency ratio generator is temperature compensated and the other parts of the frequency generator are as much as possible implemented in the digital domain.

Figure 5:
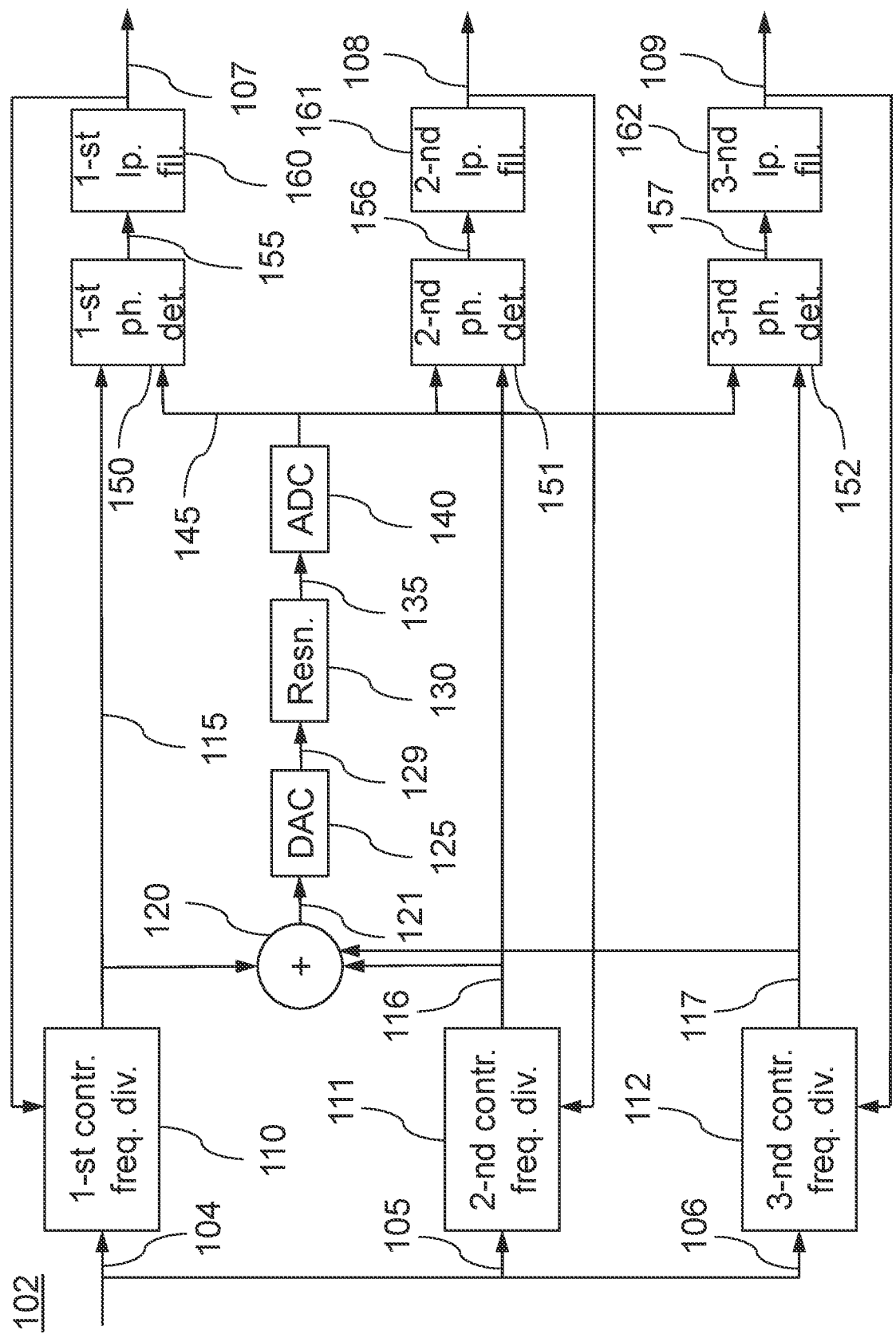
FIG. 5 schematically shows a third embodiment of a frequency ratio generator.
Figure 7:
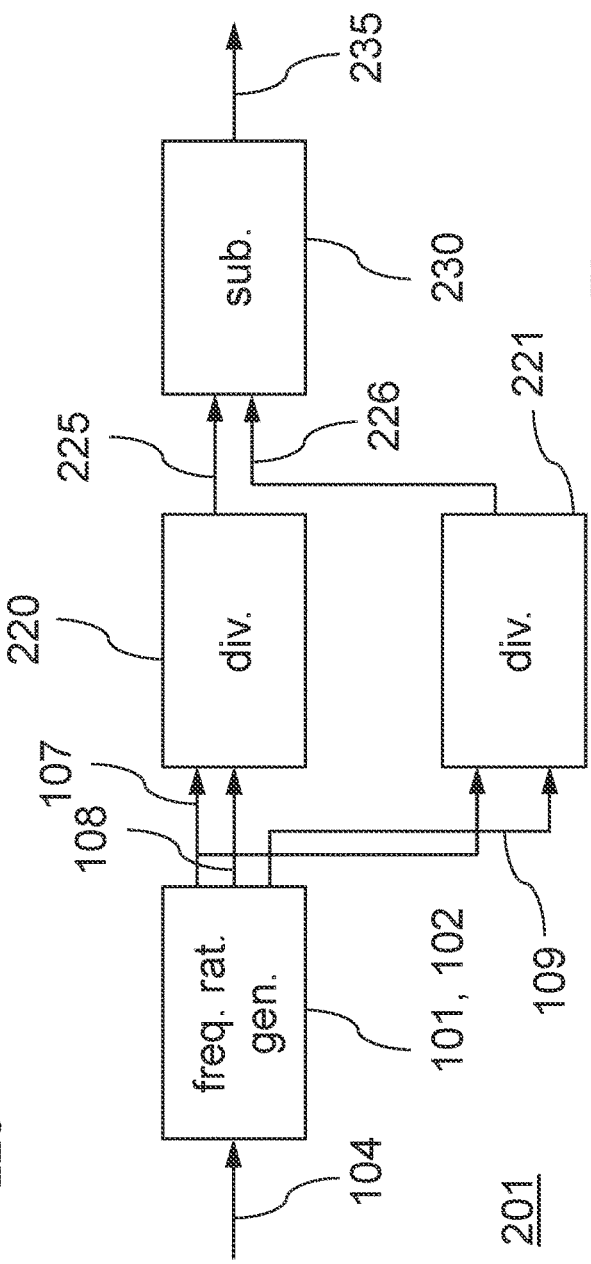
FIG. 7 schematically shows a sub-system for compensating temperature and hysteresis effects.

The embodiment of the invention in FIG. 1 may use the embodiment of the frequency ratio generator shown in FIG. 5 combined with the sub-system shown in FIG. 7 to provide a temperature and hysteresis compensated frequency generator. The frequency generator is especially insensitive to temperature variations and hysteresis when the frequency ratio generator is temperature and hysteresis compensated and the other parts of the frequency generator are as much as possible implemented in the digital domain.

Figure 2:
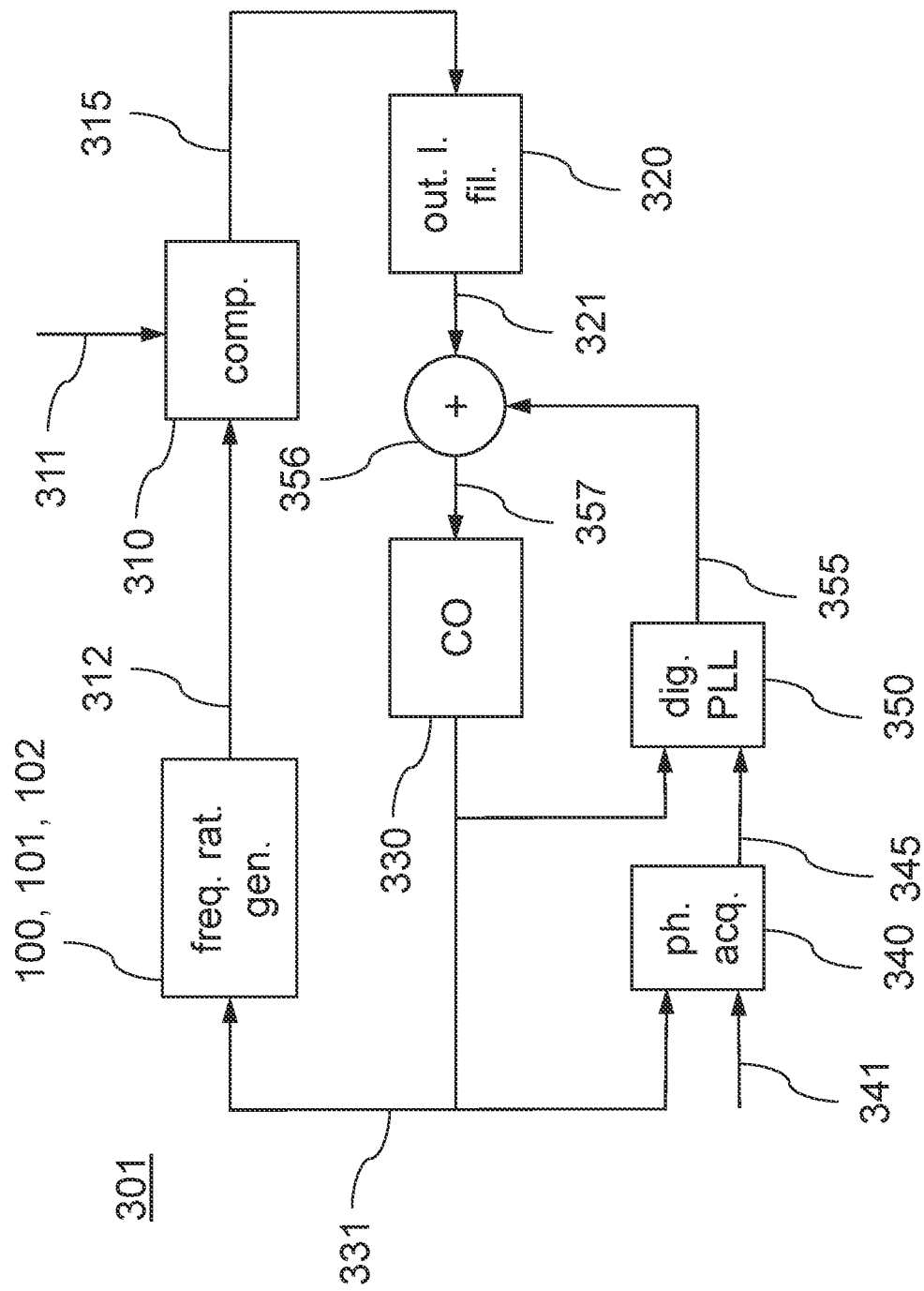
FIG. 2 schematically shows a second embodiment of the frequency generator.

FIG. 2 schematically shows a second embodiment of the frequency generator 301. The frequency generator comprises the elements, signals and features of the first embodiment. Further, the frequency generator comprises a phase acquisition circuit 340 and a PLL 350.

The phase acquisition circuit has the controlled signal having a controlled frequency and a reference signal 341 having a reference frequency as input. The phase acquisition circuit determines the phase difference between the controlled frequency and the reference frequency and outputs this difference as a phase delta signal 345.

The phase acquisition block may be implemented as a counter, wherein one input is used as clock signal to count zero-crossings of the other signal. The number of crossings relates back to the phase between the signals.

The PLL has the controlled signal and the phase delta signal as input. The PLL generates a phase lock signal based upon the controlled signal and the phase delta signal. The phase lock signal may be seen as the offset signal 355. The PLL is preferably a digital PLL or all digital PLL. The controlled frequency signal is typically used as clock input to the digital PLL.

The addition of the phase acquisition circuit and the digital PLL locks phase of the controlled frequency to the phase of the reference frequency. This embodiment is typically used for tracking a remotely generated reference frequency and thereafter locally stabilizing this reference frequency such that local reference in the form of a controlled frequency exhibits extreme low frequency jitter. This frequency generator therefore compensates or filters out any disturbances injected between the source of the reference signal and the frequency generator. Exemplary applications may be found in telecommunication, such as in smartphones or satellite phones, printed circuit boards, such as larger printed circuit boards, systems syncing to atom clocks, navigation systems, etc.

The scenario as described above for explaining the stabilizing functionality of the outer loop may be applied in a similar way to the embodiment of the frequency generator shown in FIG. 2.

Further, suppose the frequency ratio generator is stable and a zero offset signal is provided. Furthermore, suppose the controlled frequency is slightly lagging relative to the reference signal. The phase acquisition block will detect the phase difference between the controlled frequency and the reference frequency. The PLL will filter typically with a high Q-factor the phase delta signal representing the phase difference. The resulting signal from the PLL will be injected as an offset signal in the outer loop for increasing the controlled frequency. As soon as the phase acquisition circuit detects no phase difference between the phase delta signal will indicate the absence of the phase difference. The resulting signal from the PLL and injected as the offset signal in the outer loop will decrease the controlled frequency to stay in phase with the reference signal. Thus, the phase of the controlled frequency will be locked onto the phase of the reference signal. The filtering of the PLL, typically with a high Q value, will reject phase jitter in the reference signal. Hence, this embodiment provides the advantage of providing a controlled frequency with low, such as extremely low, phase jitter. This frequency generator therefore allows to filter out any disturbances, such as jitter, of the reference frequency for providing a local control signal with a controlled frequency with very stable frequency and low phase jitter.

The embodiment of the invention in FIG. 2 may use the embodiment of the frequency ratio generator shown in FIG. 3.

The embodiment of the invention in FIG. 2 may use the embodiment of the frequency ratio generator shown in FIG. 4 combined with the sub-system shown in FIG. 6 to provide a temperature compensated frequency generator. The frequency generator is especially insensitive to temperature variations when the frequency ratio generator is temperature compensated and the other parts of the frequency generator are as much as possible implemented in the digital domain.

The embodiment of the invention in FIG. 2 may use the embodiment of the frequency ratio generator shown in FIG. 5 combined with the sub-system shown in FIG. 7 to provide a temperature and hysteresis compensated frequency generator. The frequency generator is especially insensitive to temperature variations and hysteresis when the frequency ratio generator is temperature and hysteresis compensated and the other parts of the frequency generator are as much as possible implemented in the digital domain.

FIG. 3 schematically shows a first embodiment of the frequency ratio generator 100. The frequency ratio generator comprises a controlled frequency divider 110, a frequency phase detector 150 and an inner loop filter 160. The controlled frequency divider may also be labelled first controlled frequency divider. The frequency phase detector can also be labelled phase detector, first phase detector or first frequency phase detector. The inner loop filter may also be labelled first inner loop filter, first loop filter, or loop filter.

The controlled frequency divider takes as inputs a first input signal 104 and a control signal 107 and provides as output a divided signal 115. Typically, the first input signal is the controlled signal 331. The control signal may also be labelled first control signal. The divided signal may also be labelled first divided signal. The first input signal is a periodic signal having a first frequency, typically the controlled frequency. The control signal is typically a signal with a large amount of energy in the lower frequencies, such as substantially close to 0 Hz.

The controlled frequency divider generates the divided signal. The divided signal is a periodic signal having a divided frequency. The divided frequency relates to the first frequency based on the magnitude of the control signal. The magnitude of a signal may be an amplitude of the signal, a value of the signal or any other property of the signal expressing a measure. In case the control signal is an analogue signal, the magnitude is typically an amplitude of the signal. In case the control signal is a digital signal, the magnitude is typically a value of the signal. Typically, the relation between inputs and outputs of the controlled frequency divider may be linearized to $$f_{out} = \frac{f_{in}}{x-a}; x-a \in \mathbb{Z}^+, a \in \mathbb{Z}$$

wherein x is the magnitude of the control signal and a is an offset. In practical implementations the set of numbers for x and x-a are selected much more limited.

The phase detector takes as inputs the divided signal and a second input signal 135 and provides as output a first phase difference signal 155. The second input signal is a periodic signal having a second frequency. The first phase difference signal may also be labelled phase difference signal.

The magnitude of the phase difference signal relates to the phase difference between divided frequency and the second frequency. Typically, depending on the implementation of the phase detector, the magnitude of the phase difference signal may have a minimum at 0 degrees, −90 degrees or 90 degrees phase difference.

The loop filter takes as input the phase difference signal and provides as output the control signal. The loop filter is typically a low-pass filter. The loop filter stabilizes the loop or feedback loop formed by the controlled frequency divider, the divided signal, the frequency phase detector, the phase difference signal, the loop filter and the control signal. The first control signal may be outputted as a frequency ratio signal 312.

Suppose the first frequency is not changing. Furthermore, suppose the divided frequency is slightly higher compared to the second frequency and that the divided signal and the second input signal are in phase. The phase detector will detect an increasing phase difference between the two signals as the second input signal will start lagging behind compared to the divided signal. The increasing phase difference will cause the magnitude of the phase difference signal to increase. With some delay, damping and/or reduction due to being implemented as low-pass filter, the loop filter will increase the magnitude of the control signal. The increase in control signal will cause the first frequency to be divided by a larger magnitude, thus a higher number, to provide a lower divided frequency. Thus, any difference in frequency between the second frequency and the divided frequency is reduced and/or minimized with the negative feedback loop. Furthermore, as the divided frequency tracks the second frequency, the magnitude of the control signal will be indicative of the ratio between the first frequency and the second frequency.

In another scenario, suppose the first frequency is increasing. Furthermore, suppose the second frequency is stable. As the first frequency is increasing and the magnitude of the control signal is stable, the divided frequency will increase. The phase detector will detect an increasing phase difference between the two signals as the second input signal will start lagging behind compared to the divided signal. The increasing phase difference will cause the magnitude of the phase difference signal to increase. With some delay, damping and/or reduction due to being implemented as low-pass filter, the loop filter will increase the magnitude of the control signal. The increase in control signal will cause the first frequency to be divided by a larger magnitude, thus a higher number, to provide a lower divided frequency, which will be substantially the divided frequency before the increase of the first frequency. Thus, any changing first frequency will cause the divided frequency to remain substantially the same to the second frequency due to the negative feedback loop. Furthermore, as the divided frequency tracks the second frequency, the magnitude of the control signal will be indicative of the ratio between the first frequency and the second frequency, which will be increasing in this situation.

As typically the first and second frequency are both changing, a combination of the scenarios above is likely.

In order to get initial lock, the divided frequency needs to be relatively close to the second frequency, such as the resonance frequency of a resonator generating the second frequency, otherwise the lock procedure to get initial lock may be quite complex and lengthy in time. If the first or second frequency or combination of the first and second frequency move faster than the resonator loop can track, lock may be lost. Preferably, the first frequency should not change too fast to allow a faster change of the second frequency. Slow frequency movements of the first and second frequencies over a relatively large range allow lock to be maintained. Fast frequency movements of the first and second frequencies over a relatively small range also allow lock to be maintained.

For some circuits it may be known how much the frequency moves. Combining that knowledge with the circuit allows the selection of a resonator and design of the other elements in the loop for keeping lock during operation. As a rule of thumb, if the dynamic frequency tracking of the loop is slower than the combination of the change of the first and second frequencies, lock will be lost.

FIG. 4 schematically shows a second embodiment of a frequency ratio generator 101. The circuit comprises all features as described for FIG. 3. The circuit may further comprise a second controlled frequency divider 111, an adder 120, a DAC 125, a resonator 130, an ADC 140, a second phase detector 151 and a second loop filter 161.

The first controlled frequency 110 divider takes as inputs the first input signal 105 and the first control signal 108 and provides as output the first divided signal 115. The second controlled frequency divider takes as inputs a third input signal 105 and a second control signal 108 and provides as output a second divided signal 116. The adder takes as inputs the first and second divided signals and provides as output an added signal 121. The added signal is the addition of the first and second divided signals.

The optional DAC takes as input the added signal and provides as output an excitation signal 129 suitable for letting the resonator resonate. This provides the advantage of having much of the features of the circuit in the digital domain, while only needing a single DAC for providing an excitation signal, which is typically an analogue signal, to the resonator, which is typically a crystal or crystal oscillator. Furthermore, frequency dividers are typically implemented in the digital domain, providing the advantages of ease of implementation and introduction of limited phase noise. The introduction of limited phase noise is substantially due to that a controlled digital fractional frequency divider has a higher granularity compared to an integer frequency divider.

In an alternative embodiment, two DAC-s are present at respective inputs of the adder, such that the adder is an analogue adder. In another alternative embodiment, the circuit has no DAC in the loop. In even another embodiment, a DAC is between the first loop filter output and the first controlled frequency divider, preferably a second DAC is between the second loop filter output and the second controlled frequency divider.

The optional ADC takes as input the second input signal and provides as output a digital second signal 145. This provides the advantage of having much of the features of the circuit in the digital domain, while only needing a single ADC for receiving the second input signal, which is typically an analogue signal, from the resonator, which is typically a crystal. In an alternative embodiment, two ADC-s are between the respective phase detectors and loop filters. In even another embodiment, the two ADC-s are between respective loop filters and controlled frequency dividers.

The first frequency phase detector 150 takes as inputs the first divided signal 115 and the digital second signal 145 and provides as output the first phase difference signal 155. The second frequency phase detector 151 takes as inputs the second divided signal 116 and the digital second signal 145 and provides as output the second phase difference signal 156. The first loop filter 160 takes as input the first phase difference signal and provides as output the first control signal 107. The second loop filter 161 takes as input the second phase difference signal and provides as output the second control signal 108.

Typically, the first divided frequency and second divided frequency are different frequencies and both resonance frequencies of the resonator. Thus, the resonator is typically a resonator allowing resonances of different frequencies at the same time. Typically, the resonator is a crystal resonator. Furthermore, typically, at least one of the resonances is an overtone resonance, preferably both resonances are overtone resonances.

As described before, if at least one of the first and second divided frequencies are selected at an overtone frequency, the temperature behaviour may be different. The temperature may vary in a temperature range of −40° C. to +125° C. Within this range the temperature gradient for a certain overtone may vary.

Either the first control signal or the second control signal may be selected as frequency ratio signal. Typically, the first control signal and the second control signal are combined to compensate for temperature effects, specifically temperature influences on the resonator. The combination is then provided as frequency ratio signal as output. The combination may be used to select the control signal that is the least changing for a certain temperature. As shown in and explained for FIG. 6, the first and second control signals may be divided to provide a temperature indication allowing to compensate for any temperature effects of the frequency generator, frequency ratio generator and specifically the resonator. The compensation is typically predefined, such as predefined during manufacturing by providing setting to the frequency ratio generator to deduce a compensation factor for the first and second control signal and/or other signal preferably internal to the frequency ratio generator to provide a compensated frequency ratio signal.

FIG. 5 schematically shows a third embodiment of a frequency ratio generator 102. The frequency ratio generator comprises all features as described for FIG. 4. The circuit may further comprise a third controlled frequency divider 112, a third phase detector 152 and a third loop filter 162.

The first controlled frequency 110 divider takes as inputs the first input signal 105 and the first control signal 108 and provides as output the first divided signal 115. The second controlled frequency divider takes as inputs a third input signal 105 and a second control signal 108 and provides as output a second divided signal 116. The third controlled frequency divider takes as inputs a fourth input signal 106 and a third control signal 109 and provides as output a third divided signal 117. The adder takes as inputs the first, second and third divided signals and provides as output an added signal 121. The added signal is the addition of the first, second and third divided signals.

The first frequency phase detector 150 takes as inputs the first divided signal 115 and the digital second signal 145 and provides as output the first phase difference signal 155. The second frequency phase detector 151 takes as inputs the second divided signal 116 and the digital second signal 145 and provides as output the second phase difference signal 156. The third frequency phase detector 152 takes as inputs the third divided signal 117 and the digital third signal 145 and provides as output the third phase difference signal 157. The first loop filter 160 takes as input the first phase difference signal and provides as output the first control signal 107. The second loop filter 161 takes as input the second phase difference signal and provides as output the second control signal 108. The third loop filter 162 takes as input the third phase difference signal and provides as output the third control signal 109.

Typically, the first divided frequency, second divided frequency and third divided frequency are different frequencies and all resonance frequencies of the resonator. Thus, the resonator is typically a resonator allowing resonances of different frequencies at the same time. Typically, the resonator is a crystal resonator. Furthermore, typically, at least two of the resonances are an overtone resonance, preferably all resonances are overtone resonances.

As described before, if at least one of the first and second divided frequencies is selected at an overtone frequency, the temperature behaviour may be different. The temperature may vary in a temperature range of −40° C. to +125° C. Within this range the temperature gradient for a certain overtone may vary.

Either the first control signal, the second control signal or the third control signal may be selected as frequency ratio signal. Typically, the first control signal, the second control signal and/or the third control signal are combined to compensate for temperature and/or hysteresis effects, specifically temperature and hysteresis influences on the resonator. The combination is then provided as frequency ratio signal as output. The combination may be to select the control signal that is the least changing for a certain temperature. As shown in and explained for FIG. 7, the first and second control signals may be divided to provide a first indication and the first and third control signals may be divided to provide a second indication. Both or at least one allows to compensate for any temperature effects of the frequency generator, frequency ratio generator and specifically the resonator. Both indications, when subtracted, allow to compensate for any hysteresis effects of the frequency generator, the frequency ratio generator and specifically the resonator. The compensation is typically predefined, such as predefined during manufacturing by providing setting to the frequency ratio generator to deduce a compensation factor for the first, second and third control signal and/or other signal preferably internal to the frequency ratio generator to provide a compensated frequency ratio signal.

FIG. 6 schematically shows a sub-system 200 for compensating temperature effects. The sub-system comprises a frequency ratio generator 101, 102 according to any of the embodiments of the invention comprising the resonator and providing the control signal 107 and the second control signal 108, such as in FIGS. 1 and 2. The sub-system further comprises a control signal divider 220 arranged for generating a divided control signal 225 based on division of the control signal by the second control signal. The divided control signal is the temperature indication 225. The temperature indication may be used to apply a temperature compensation to the frequency ratio signal in a separate unit to provide a temperature compensated frequency ratio.

FIG. 7 schematically shows a sub-system 201 for compensating temperature and hysteresis effects. The system comprises a frequency ratio generator 211 according to any of the embodiments of the invention comprising the resonator and providing the control signal 107, the second control signal 108 and the third control signal 109. The sub-system further comprises a first control signal divider 220 arranged for generating a divided control signal 225 based on division of the control signal by the second control signal. The first divided control signal is the first temperature indication 225. The system further comprises a second control signal divider 221 arranged for generating a second divided control signal 226 based on division of the control signal by the third control signal. The second divided control signal is the second temperature indication 226.

The system further optionally comprises a subtractor 230 arranged for generating a subtracted signal 235 based on subtracting the second divided control signal from the first divided control signal. Typically, the first divided control signal and the second divided control signal have distinct minimum temperature activities. The subtracted signal is the temperature indication and/or hysteresis indication. Based on this subtracted signal the first, second and/or third control signals may be corrected for temperature and hysteresis influences, especially from the resonator. Furthermore, the frequency ratio signal may be compensated for temperature and hysteresis in a separate unit to provide a temperature and hysteresis compensated frequency ratio.

The embodiment in FIG. 4 combined with the feature that the embodiment is arranged to resonate at two distinct resonance frequencies, selected such that the resonance frequencies have distinct activity dips, the first and second control signals, indicative for the first and second ratio respectively, would be suitable for measuring changes in temperature of the resonator, preferably a crystal resonator. Distinct minimum temperature activities in the context of this application are minimums having their minimum frequency change at different or distinct temperatures. This minimum change may be relative to another the frequency of another signal. This embodiment provides the advantage of being able to measure temperature changes of the resonator over the whole temperature range with a high degree of accuracy. Another advantage is that dividing of the first ratio by the second ratio provides a ratio independent of the first frequency. Thus, any temperature dependent variation of the first frequency may be eliminated.

Furthermore, the embodiment in FIG. 4 may be extended to comprise a third loop as shown in FIG. 5. The third loop comprises a 3-th controlled frequency divider 112, a 3-th phase detector 152 and a 3-th loop filter 162 all arranged in a similar way as for the first and second loop. Further, this embodiment is extended with a first control signal divider generating a first divided control signal by dividing the control signal by the second control signal. Further, this embodiment is extended with a second control signal divider generating a second divided control signal by dividing the control signal by the third control signal. Further, this embodiment is extended with a subtractor arranged for generating a subtracted signal based on subtracting the second divided control signal from the first divided control signal, wherein the subtracted signal is indicative of the temperature of the resonator. Further, at least the first divided control signal and the second divided control signal have distinct minimum temperature activities.

This embodiment provides the advantage of being able to measure temperature changes of the resonator over the whole temperature range with a high degree of accuracy. Another advantage is that the divisions of the ratios provide divided ratios, which are independent of the first frequency. Thus, any temperature dependent variation of the first frequency may be eliminated or at least minimized. Furthermore, any behaviour of the resonator changing the resonance frequencies of the resonator, such as time dependent behaviour e.g. hysteresis, may be compensated.

The used frequency measurement technique allows measurement accuracy in the order of 0.1 ppb at a speed of 1 k samples/s. This shifts to that the system is advantageously capable of measuring, with a stable first frequency, of small temperature changes of the resonator, such as crystal. Small temperature changes may be in the range of milli-Kelvin. Further, the system is typically capable to respond sufficiently fast to changes.

In an embodiment of the frequency ratio generator, an offset is added to the phase difference signal. This allows for letting the loop lock on a different angle. For example, if the frequency phase detector has a minimum output signal for 0-degrees phase shift on its inputs, the offset will cause the loop to lock at non-0-degrees. For example, if the frequency phase detector has a minimum output signal for 90-degrees phase shift on its inputs, the offset will cause the loop to lock at non-90-degrees.

In an embodiment, a resonator, such as a crystal oscillator, crystal or crystal resonator, may be used, which is indirectly read out. This indirectly reading out may introduce a phase shift. This introduced phase shift may be corrected for with the introduction of an offset as described above.

One or more of the signals are typically normalized to simplify further calculations with these signals.

In a variation of the frequency generator, the frequency ratio signal is based on the first phase difference signal, the second phase difference signal and/or the third phase difference signal. The selection from or weight of each of the phase difference signals may still be based on the first control signal, the second control signal and/or the third control signal. This variation provides the advantage that the inner loop signals are only filtered by the inner loop filter and the outer loop signals are only filtered by the outer loop filter. Each of the filters, especially the outer loop, may be tailored to the specific requirements of that loop. The requirements for each loop typically strike a balance between stability of the loop and agility to outside changes.

In a variation of the frequency generator, the outer loop filter 320 and the adder 356 are swapped, such that the offset signal passes also through the outer loop filter. This variant has the advantage of additionally filtering the offset signal to further stabilize this signal. The original configuration, as shown in FIG. 2, provides the advantage of solely filtering the signals through the PLL, such that the optimal balance can be reached or approached between stability and agility of this loop formed by the controlled oscillator and the PLL and also for the loop formed by the controlled oscillator, phase acquisition circuit and the PLL.

To facilitate the collaboration between the different blocks mentioned throughout this description and shown in the figures, it might be necessary to scale, shift signals and/or inverted signals. For example, the frequency ratio signal and the target ratio are typically inverted in the comparator to come to a comparison signal, which is suitable to be processed by the rest of the system.

FIG. 8 schematically shows an embodiment of a computer program product 1000, computer readable medium 1010 and/or non-transitory computer readable storage medium comprising a computer readable code 1020. The computer readable code implements methods mentioned throughout the description according to the invention.

A signal may be periodic signals. A periodic signal repeats itself after every period. The amount of repetitions per second equals the frequency. Furthermore, a signal may have a maximum magnitude, such as an amplitude or a value, an average signal level and an RMS level. A signal in the context of this text may be an analogue signal, such as a voltage signal, a current signal, a power signal and/or an energy signal. A signal in the context of this text may also be a digital signal representing a voltage signal, a current signal, a power signal and/or an energy signal. The frequency ratio is a frequency ratio signal.

A controlled frequency divider may be a digital controlled frequency divider. The controlled frequency divider may be a controlled multiple frequency divider. The controlled multiple frequency divider provides an output signal having an output frequency equal to an input frequency of an input signal divided by n, wherein n is a number of the collection N. In formula:

$$f_{out} = \frac{f_{in}}{x}; x \in \mathbb{N}^+$$

Alternatively, the controlled frequency divider may be a controlled fractional divider. In formula:

$$f_{out} = \frac{f_{in}}{x}; x \in \mathbb{Q}^+$$

in practical implementations, the controlled fractional frequency divider may be limited to for example:

$$f_{out} = \frac{f_{in}}{x}; x \in \mathbb{Z}^+$$

An exemplary embodiment of a digital controlled multiple frequency divider is, wherein the divider switches between a division number N and N+1. A prerequisite is that if the divided signal is fed to a resonator, this resonator has a decent quality Q. By switching between N and N+1, for instance fractional numbers such as N+¾ or N+⁵⁄₇ are possible.

The implementation of such a digital controlled multiple frequency divider may be done with the addition of an accumulator with a settable maximum value. In the example of N+¾ an accumulator with a maximum capacity of 4 and a repeatedly added number of 3 will have a carry in 3 out of the 4 cycles. Each time the carry is present the divider should divide by the N+1 number, any other time the divider should divide by N. This technique may be typed as shaping.

Higher order shaping may be done by adding another accumulator and a small differentiator. As a result, for higher order shaping the digital controlled frequency divider may divide by either N−1, N, N+1 or N+2. Higher order shaping causes the spectral behaviour to show a steeper roll off causing less noise in the loop. Higher order shaping provides the circuit with the advantage of a more stable frequency ratio.

A DTC (Digital to Time Converter) may be used to shift the edge of a signal, such as the output of a digital controlled multiple frequency divider. The digital controlled multiple frequency divider divides N alternated in some pattern by division by N+1, while the DTC interpolates the edges to be on near perfect time. A DTC therefore may decrease the jitter introduced in the circuit providing the advantage of a more stable circuit and/or frequency ratio.

The two methods above, being a digital controlled multiple frequency divider and a DTC, have different performance in the sense of noise and accuracy. The digital controlled multiple frequency divider provides a divided signal wherein the loop stability and optionally accuracy rely on filtering rejection by the loop filter and if present on the resonator. On the other hand, the DTC provides much better initial accuracy, but has as a disadvantage that it adds a spectrally large noise component. Which advantage or disadvantage is dominant is not easily determined as the advantages and disadvantages vary with the behaviour of the other circuit components, specifically with the other circuit components in the loop, and the signals provided to the circuit.

The frequency phase detector may be a frequency mixer, analogue multiplier, digital circuit or logic circuit configured as phase detector. A frequency phase detector, phase detector or phase generates an output signal, such as a phase difference signal, which represents the difference in phase between two input signals, such as between a divided signal and a second input signal. Depending on the type of frequency phase detector, the input signals may need to be phase shifted to provide an output signal which may be used to lock on for the loop. As an example, a logic circuit phase detector, made from ex-OR logic gates, typically locks the loop at a 90° degree phase shift between the input signals.

The inner and outer loop filters stabilize the inner and outer loop, respectively. The inner and outer loop filters may further stabilize the respective loop in view of the input signals provided to the frequency ratio generator and frequency generator, respectively. If a resonator is present, the inner and outer loop filters may further stabilize the circuit taking into account the resonator behaviour. The inner and outer loop filters may be a first or multiple order filter. The loop filters are typically low-pass filters. The cut-off frequency of the loop-filters are typically a balance between accuracy and speed of correction of disturbances in the circuit. A lower cut-off frequency provides more accuracy as less jitter is allowed trough the respective loop filter, while a higher cut-off frequency provides a quicker response to changes in the circuit, such as temperature changes. Also, the respective loop lock behaviour of the circuit may be influenced by the respective loop filter, specifically the selection of the cut-off frequency. An important factor when designing a loop filter is to consider the loop gain. The respective loop filter is typically implemented as a PID controller.

A resonator has a fundamental frequency, which is the lowest frequency of resonance. Further, the resonator may resonate at harmonic frequencies, which adhere to the relation $$f_{harmonic} = f_{fundamental} * 2\pi x; x \in \mathbb{N}^+$$

Further, the resonator may resonate at an overtone frequency, which adheres to the relation $$f_{overtone} = f_{fundamental} * (2\pi x + y); x \in \mathbb{N}^+, 0 < y << 2\pi$$

Resonance frequencies of a crystal, a crystal oscillator or crystal resonator may be even or odd harmonics and the associated overtones. Typically, the odd harmonics and associated overtones are used for letting crystals resonate.

It should be noted that the figures are purely diagrammatic and not drawn to scale. In the figures, elements which correspond to elements already described may have the same reference numerals.

It will be appreciated that the invention also applies to computer programs, particularly computer programs on or in a carrier, adapted to put the invention into practice. The program may be in the form of a source code, an object code, a code intermediate source and an object code such as in a partially compiled form, or in any other form suitable for use in the implementation of the method according to the invention. It will also be appreciated that such a program may have many different architectural designs. For example, a program code implementing the functionality of the method or system according to the invention may be sub-divided into one or more sub-routines. Many different ways of distributing the functionality among these sub-routines will be apparent to the skilled person. The sub-routines may be stored together in one executable file to form a self-contained program. Such an executable file may comprise computer-executable instructions, for example, processor instructions and/or interpreter instructions (e.g. Java interpreter instructions). Alternatively, one or more or all of the sub-routines may be stored in at least one external library file and linked with a main program either statically or dynamically, e.g. at run-time. The main program contains at least one call to at least one of the sub-routines. The sub-routines may also comprise function calls to each other. An embodiment relating to a computer program product comprises computer-executable instructions corresponding to each processing stage of at least one of the methods set forth herein. These instructions may be sub-divided into sub-routines and/or stored in one or more files that may be linked statically or dynamically. Another embodiment relating to a computer program product comprises computer-executable instructions corresponding to each means of at least one of the systems and/or products set forth herein. These instructions may be sub-divided into sub-routines and/or stored in one or more files that may be linked statically or dynamically.

The carrier of a computer program may be any entity or device capable of carrying the program. For example, the carrier may include a data storage, such as a ROM, for example, a CD ROM or a semiconductor ROM, or a magnetic recording medium, for example, a hard disk. Furthermore, the carrier may be a transmissible carrier such as an electric or optical signal, which may be conveyed via electric or optical cable or by radio or other means. When the program is embodied in such a signal, the carrier may be constituted by such a cable or other device or means. Alternatively, the carrier may be an integrated circuit in which the program is embedded, the integrated circuit being adapted to perform, or used in the performance of, the relevant method.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or stages other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

Examples, embodiments or optional features, whether indicated as non-limiting or not, are not to be understood as limiting the invention as claimed.

The invention claimed is:
1. A frequency generator for generating a controlled signal having a controlled frequency, comprising:
 a frequency ratio generator arranged for generating a frequency ratio, comprising:
 an input configured for receiving the controlled signal;
 a first controlled frequency divider arranged for generating a first divided signal having a first divided frequency being substantially the controlled frequency divided by a first frequency ratio signal;
 a converter arranged for generating an excitation signal having the first divided frequency based on the first divided signal, wherein the excitation signal is provided to the resonator for excitation of the resonator;
 a resonator arranged for generating a resonance signal having a first resonance frequency, wherein the resonator is excited by the excitation signal;
 a first frequency phase detector arranged for generating a first phase difference signal based on a first frequency phase difference between the first divided frequency and the first resonance frequency;
 a first inner loop filter arranged for generating the first frequency ratio signal; and
 an output configured for providing a frequency ratio signal based on the first frequency ratio signal indica- tive of the frequency ratio between the controlled frequency and the first resonance frequency;
wherein a first frequency ratio generator loop is formed by the first controlled frequency divider, the first divided signal, the first frequency phase detector, the first phase difference signal, the first inner loop filter and the first frequency ratio signal;
wherein a second frequency ratio generator loop is formed by the first controlled frequency divider, the first divided signal, the converter, the excitation signal, the resonator, the resonance signal, the first frequency phase detector, the first phase difference signal, the first inner loop filter and the first frequency ratio signal; and
wherein the first inner loop filter filters the first phase difference signal such that instability of the frequency ratio generator loops is prevented; and
a comparator arranged for generating a comparison signal based on the comparison of the frequency ratio with a target ratio; and
a controlled oscillator circuit arranged for generating the controlled signal having the controlled frequency based on the comparison signal.

2. The frequency generator according to claim 1, further comprising:
an outer loop filter arranged for generating a filtered comparison signal based on the comparison signal;
wherein the controlled frequency is based on the filtered comparison signal;
wherein an outer loop is formed by the frequency ratio generator, the comparator, the comparison signal, the outer loop filter, the filtered comparison signal, the controlled oscillator and the controlled signal; and
wherein the outer loop filter filters the comparison signal such that instability of the outer loop is prevented.

3. The frequency generator according to claim 1,
wherein the comparator comprises a subtractor arranged for providing the comparison signal based on subtracting the target ratio from the frequency ratio; or
wherein the comparator comprises a divider arranged for providing the comparison signal based on dividing of the frequency ratio by the target ratio.

4. The frequency generator according to claim 3, wherein the frequency ratio generator comprises:
a second controlled frequency divider arranged for generating a second divided signal having a second divided frequency being substantially the controlled frequency divided by a second frequency ratio signal;
a second frequency phase detector arranged for generating a second phase difference signal based on a second frequency phase difference between the second divided frequency and the second resonance frequency;
a second inner loop filter arranged for generating the second frequency ratio signal indicative of the second frequency ratio based on the second phase difference signal;
an adder arranged for generating an added signal supplied to the converter, wherein the added signal has the first divided frequency and the second divided frequency;
a temperature compensator for compensating changes in resonance frequency of the resonator, wherein the temperature compensator comprises:
an input configured for receiving the first frequency ratio and the second frequency ratio;
a first divider arranged for generating a first division value based on dividing of the first frequency ratio by the second frequency ratio;
a calculator arranged for calculating a compensation factor based on the value of one or more of the group of the first phase difference signal, the second phase difference signal, the first frequency ratio and the first division value, wherein the calculator comprises a look-up table; and
a redresser arranged for generating the frequency ratio based on redressing a signal based on one or more of the group of the first phase difference signal, the second phase difference signal and the first frequency ratio with the compensation factor;
wherein the excitation signal is based on the added signal;
wherein a third frequency ratio generator loop is formed by the second controlled frequency divider, the second divided signal, the second frequency phase detector, the second phase difference signal, the second inner loop filter and the second frequency ratio signal;
wherein a fourth frequency ratio generator loop is formed by the second controlled frequency divider, the second divided signal, the converter, the excitation signal, the resonator, the resonance signal, the second frequency phase detector, the second phase difference signal, the second inner loop filter and the second frequency ratio signal; and
wherein the second inner loop filter filters the second phase difference signal such that instability of the frequency ratio generator loops is prevented.

5. The frequency generator according to claim 4, wherein the frequency ratio generator further comprises:
a selector arranged for selecting one or more of the group of the first phase difference signal, the second phase difference signal and the first frequency ratio based on the value of one or more of the group of the first frequency ratio and the first division value;
wherein the redresser is arranged for generating the frequency ratio based on redressing the selected frequency ratio with the compensation factor.

6. The frequency generator according to claim 4, wherein the frequency ratio generator further comprises:
a third controlled frequency divider arranged for generating a third divided signal having a third divided frequency being substantially the controlled frequency divided by a third frequency ratio signal;
a third frequency phase detector arranged for generating a third phase difference signal based on a third frequency phase difference between the third divided frequency and the third resonance frequency;
a third inner loop filter arranged for generating the third frequency ratio signal indicative of the third frequency ratio based on the third phase difference signal;
wherein the added signal also has the third divided frequency;
wherein the input of the temperature compensator is further configured for receiving the third frequency ratio; and
wherein the temperature compensator further comprises:
a second divider arranged for generating a second division value based on dividing of the first frequency ratio by the third frequency ratio;
wherein the selector is further arranged for selecting also from the group of the third phase difference signal, the second frequency ratio and the third frequency ratio and also based on the value of one or more of the extended group of the second frequency ratio, the third frequency ratio and the second division value;

wherein the calculator is further arranged for calculating the compensation factor based on the value of one or more of the group extended with the third phase difference signal, the second frequency ratio, the third frequency ratio and the second division value;

wherein the redresser is arranged for generating the frequency ratio based on redressing the selected frequency ratio with the compensation factor;

wherein a fifth frequency ratio generator loop is formed by the third controlled frequency divider, the third divided signal, the third frequency phase detector, the third phase difference signal, the third inner loop filter and the third frequency ratio signal;

wherein a sixth frequency ratio generator loop is formed by the third controlled frequency divider, the third divided signal, the converter, the excitation signal, the resonator, the resonance signal, the third frequency phase detector, the third phase difference signal, the third inner loop filter and the third frequency ratio signal; and wherein the third inner loop filter filters the third phase difference signal such that instability of the frequency ratio generator loops is prevented.

7. The frequency generator according to claim 6, wherein the selector of the frequency ratio generator is arranged for:
selecting one of the group of the first frequency ratio, the second frequency ratio and the third frequency ratio, wherein the selected ratio is based on the value of one or more of the group of the first frequency ratio, the second frequency ratio, the third frequency ratio, the first division value and the second division value; or
selecting a weighted combination of two or more of the first frequency ratio, the second frequency ratio and the third frequency ratio, wherein the weighted combination is based on the value of one or more of the group of the first frequency ratio, the second frequency ratio, the third frequency ratio, the first division value and the second division value.

8. The frequency generator according to any of claim 4, wherein the first division value is solely based on the first frequency ratio signal and the second frequency ratio signal;
wherein the second division value is solely based on the first frequency ratio signal and the third frequency ratio signal;
wherein the selector is arranged for selecting one or more of the limited group of the first phase difference signal, the second phase difference signal and the third phase difference signal; or
wherein the calculator is arranged for calculating a compensation factor based on the value of one or more of the limited group of the first division value and the second division value.

9. The frequency generator according to claim 8, wherein the frequency ratio generator further comprises an analog-to-digital converter arranged for generating a digital resonance signal based on the resonance signal, wherein the digital resonance signal is supplied to at least the first frequency phase detector.

10. The frequency generator according to claim 9, wherein the converter of the frequency ratio generator comprises a digital-to-analog converter arranged for generating the excitation signal based on the divided signal.

11. The frequency generator according to claim 1, wherein the comparator comprises:
a scaler arranged for generating a scaled signal, which is the frequency ratio signal scaled by a scaling factor; or
shifter arranged for generating a shifted signal, which is the scaled signal shifted by a shift value;
wherein the comparison signal is based on the shifted signal.

12. The frequency generator according to claim 1, comprising:
a phase acquisition circuit arranged for generating a phase delta signal based on the phase difference between the controlled frequency and a reference signal having a reference frequency; and
a PLL (Phase Locked Loop) arranged for generating an offset signal based on the phase delta signal;
wherein the controlled frequency is also based on the offset signal.

13. The frequency generator according to claim 12,
wherein the comparator comprises a shifter arranged for generating a shifted signal, which is the scaled signal shifted by a shift value, and the shift value is the offset signal; or
further comprising an outer loop filter arranged for generating a filtered comparison signal based on the comparison signal, wherein the filtered comparison signal is indirectly based on the offset signal.

14. A frequency generator system comprising the frequency generator according to claim 1, and further comprising:
a frequency generator chip including the frequency generator;
a resonator for connecting to the frequency generator chip for generating the resonance signal; and
an oscillator for connecting to the controlled oscillator circuit for generating an oscillating signal.

15. A method for generating a controlled signal having a controlled frequency, comprising the steps of:
receiving a resonance signal having a first resonance frequency from a resonator;
providing a first ratio signal indicative of the first frequency ratio between the controlled frequency and the first resonance frequency;
generating a first phase difference signal based on a first frequency phase difference between a first divided frequency and a first resonance frequency;
filtering the first phase difference signal for generating the first frequency ratio signal; such that instability of the frequency ratio generator loops are prevented;
basing a frequency ratio on the first frequency ratio signal;
providing a target ratio;
generating a comparison signal based on the comparison of the frequency ratio with the target ratio;
generating the controlled signal having the controlled frequency based on the comparison signal;
generating a first divided signal having a first divided frequency being substantially the controlled frequency divided by the first frequency ratio signal;
generating an excitation signal having the first divided frequency based on the first divided signal, wherein the excitation signal is provided to the resonator for excitation of the resonator; and outputting the controlled signal;

wherein a first frequency ratio generator loop is formed by the first divided signal, the first phase difference signal and the first frequency ratio signal;

wherein a second frequency ratio generator loop is formed by the first divided signal, the excitation signal, the resonator, the resonance signal, the first phase difference signal and the first frequency ratio signal; and wherein the step of filtering filters the first phase difference signal such that instability of the frequency ratio generator loops are prevented.

16. The method of claim 15, wherein Computer a computer program product comprising a computer readable medium having computer readable code embodied therein is configured such that, on execution by a suitable computer or processor, the computer or processor is caused to perform the steps of providing the first ratio signal indicative of the first frequency ratio between the controlled frequency and the first resonance frequency;

basing the frequency ratio on the first frequency ratio signal;

generating the comparison signal based on the comparison of the frequency ratio with the target ratio;

generating the controlled signal having the controlled frequency based on the comparison signal;

generating the excitation signal having the first divided frequency based on the first divided signal, wherein the excitation signal is provided to the resonator for excitation of the resonator; and outputting the controlled signal.

17. A computer program product comprising a computer readable medium having computer readable code embodied therein, the computer readable code being configured such that, on execution by a suitable computer or processor, the computer or processor is caused to perform the method of claim 15.

* * * * *